(12) United States Patent
Suguro

(10) Patent No.: US 8,836,075 B2
(45) Date of Patent: Sep. 16, 2014

(54) SEMICONDUCTOR DEVICE AND FABRICATION METHOD THEREOF

(75) Inventor: Kyoichi Suguro, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/419,882

(22) Filed: Mar. 14, 2012

(65) Prior Publication Data
US 2013/0069195 A1  Mar. 21, 2013

(30) Foreign Application Priority Data
Sep. 20, 2011 (JP) ................................. 2011-205078

(51) Int. Cl.
*H01L 21/70* (2006.01)
*H01L 21/8238* (2006.01)
*H01L 21/762* (2006.01)

(52) U.S. Cl.
CPC ............................... *H01L 21/76254* (2013.01)
USPC .......................................... 257/506; 438/207

(58) Field of Classification Search
CPC ............ H01L 21/768; H01L 21/76816; H01L 21/76838; H01L 21/28026; H01L 21/823475; H01L 21/823871; H01L 23/552; H01L 25/16; H01L 27/14636; H01L 2224/19; H01L 2224/25; H01L 2225/06541
USPC .................. 257/618–628, E21.122–E21.128, 257/E21.567–E21.57; 438/33, 68, 107, 438/113, 460–465, 963, 974
See application file for complete search history.

(56) References Cited

U.S. PATENT DOCUMENTS 7,939,389 B2   5/2011  Ohnuma et al.
8,288,215 B2  10/2012  Ohnuma et al.
2001/0007367 A1*  7/2001  Ohkubo ........................ 257/347
2007/0026650 A1*  2/2007  Hebras .......................... 438/514
2009/0170287 A1*  7/2009  Endo et al. .................... 438/458
2009/0181552 A1*  7/2009  Shimomura et al. .......... 438/795
2009/0239354 A1*  9/2009  Suzawa et al. ................ 438/458
2009/0263942 A1  10/2009  Ohnuma et al.
2011/0171791 A1   7/2011  Ohnuma et al.

FOREIGN PATENT DOCUMENTS

JP  2004-310056 A  11/2004
JP  2008-263010     10/2008
JP  2009-130289      6/2009
JP  2009-278073 A  11/2009

OTHER PUBLICATIONS

Bruel, Michael, "Application of hydrogen ion beams to Silicon on Insulator material technology", Nuclear Instruments and Methods in Physics Research B 108, pp. 313-319 (1996).

Höchbauer, T. et al., "Comparison of thermally and mechanically induced Si layer transfer in hydrogen-implanted Si wafers", Nuclear Instrument and Methods in Physics Research B 216, pp. 257-263 (2004).

Notification of Reason for Rejection issued in corresponding Japanese Patent Application No. 2011-205078, mailed Feb. 4, 2014, 7 pages.

* cited by examiner

*Primary Examiner* — Chuong A Luu
*Assistant Examiner* — Moin Rahman
(74) *Attorney, Agent, or Firm* — Finnegan, Henderson, Farabow, Garrett & Dunner, L.L.P.

(57) ABSTRACT

According to one embodiment, a fabrication method for a semiconductor device includes: injecting an ion into a first substrate; joining the first substrate and a second substrate; irradiating a microwave to agglomerate the ion in a planar state in a desired position in the first substrate and form an agglomeration region spreading in a planar state; separating the second substrate provided with a part of the first substrate from the rest of the first substrate by exfoliating the joined first substrate from the second substrate in the agglomeration region; and grinding a part of the second substrate on a back surface opposite to an exfoliated surface in the second substrate provided with a part of the first substrate.

13 Claims, 18 Drawing Sheets

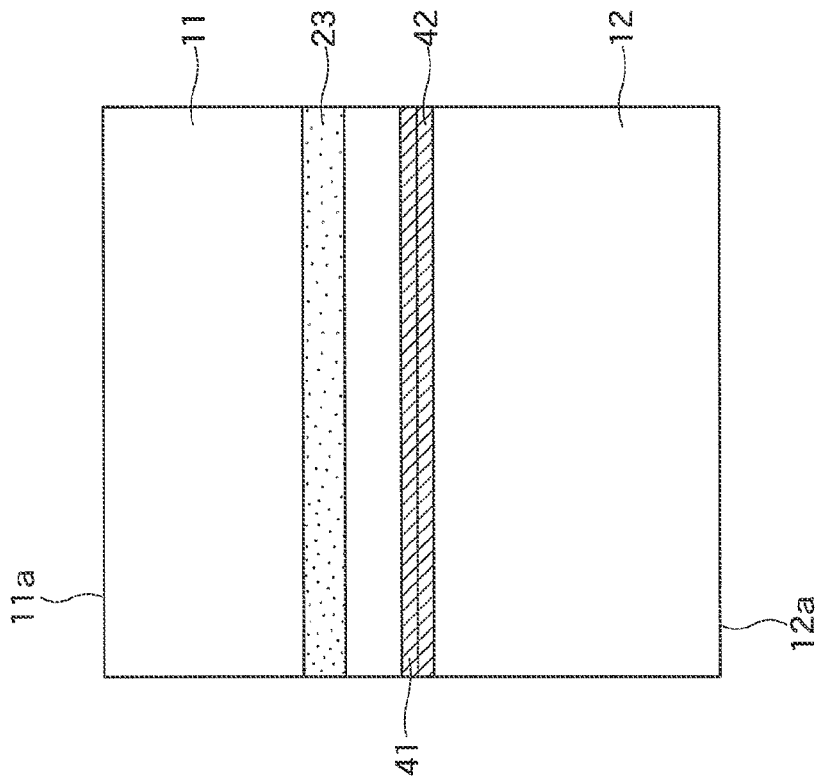
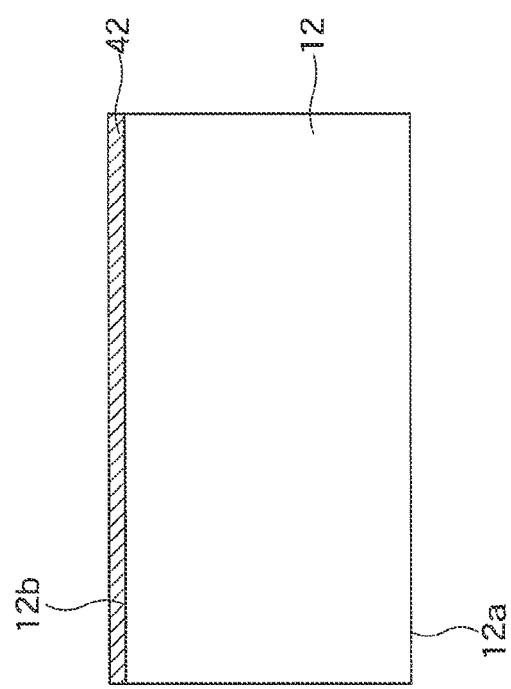

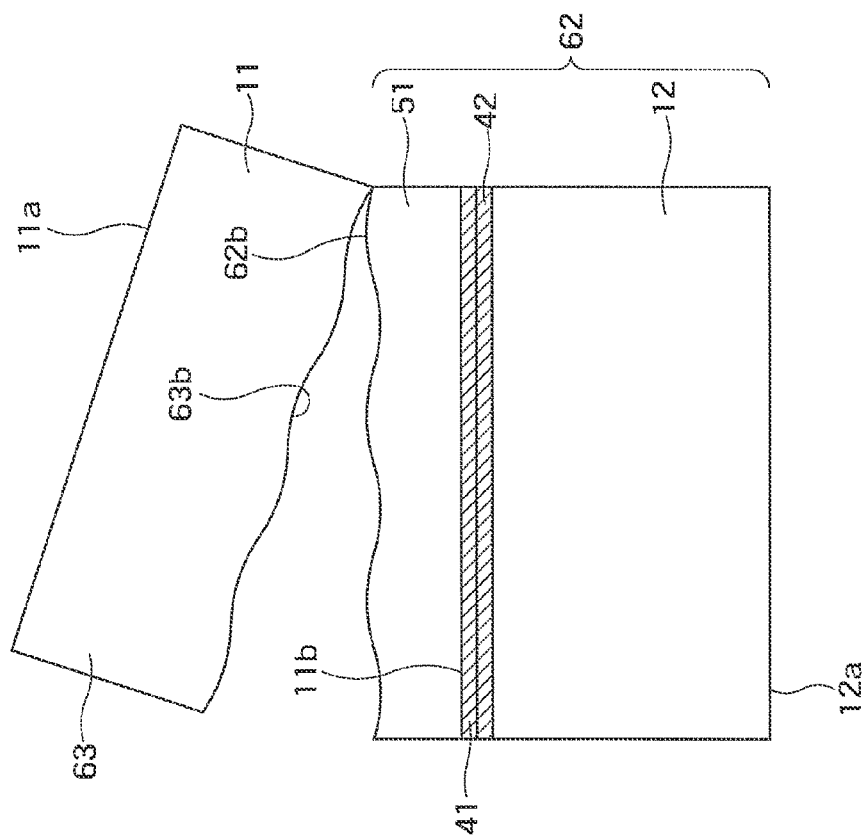
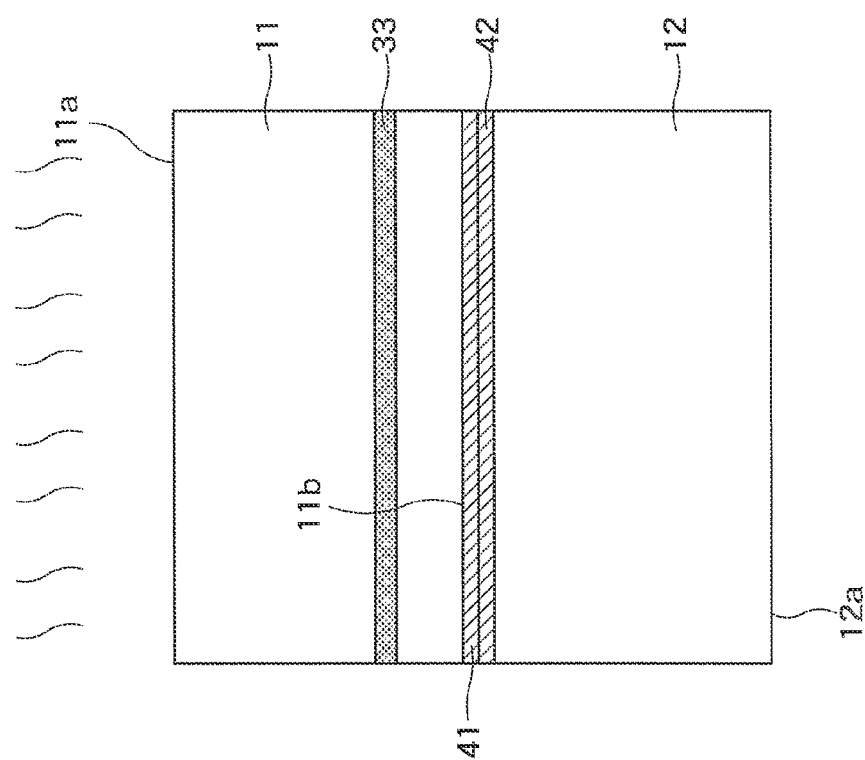
FIG. 1F
FIG. 1E

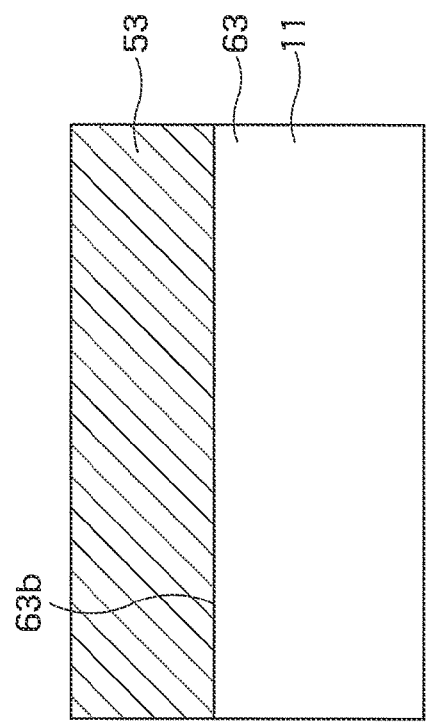
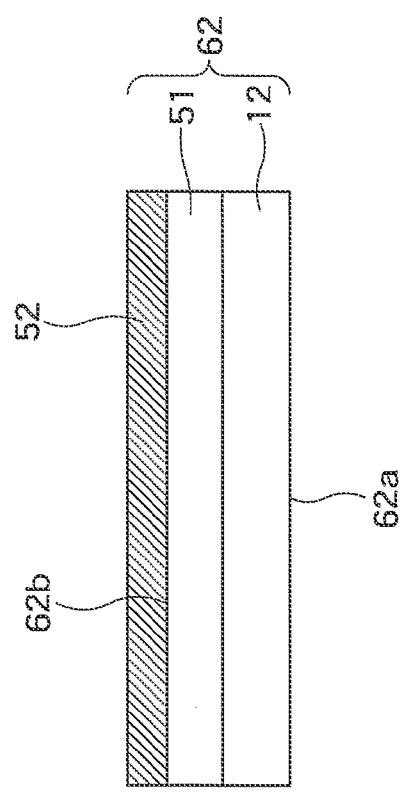

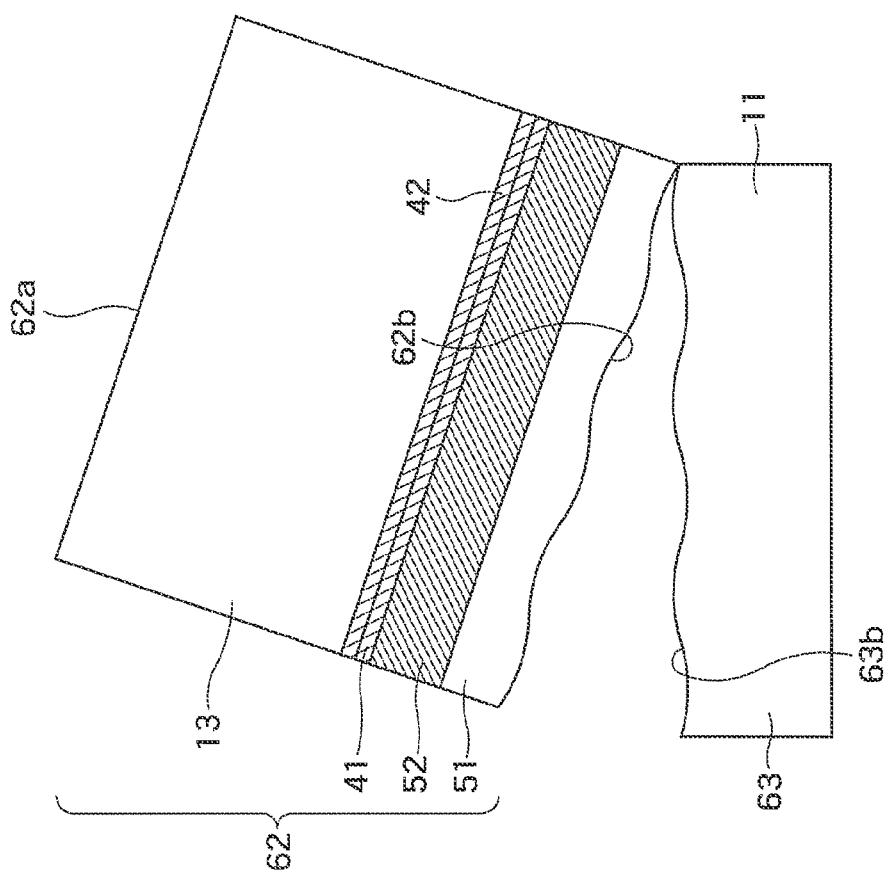
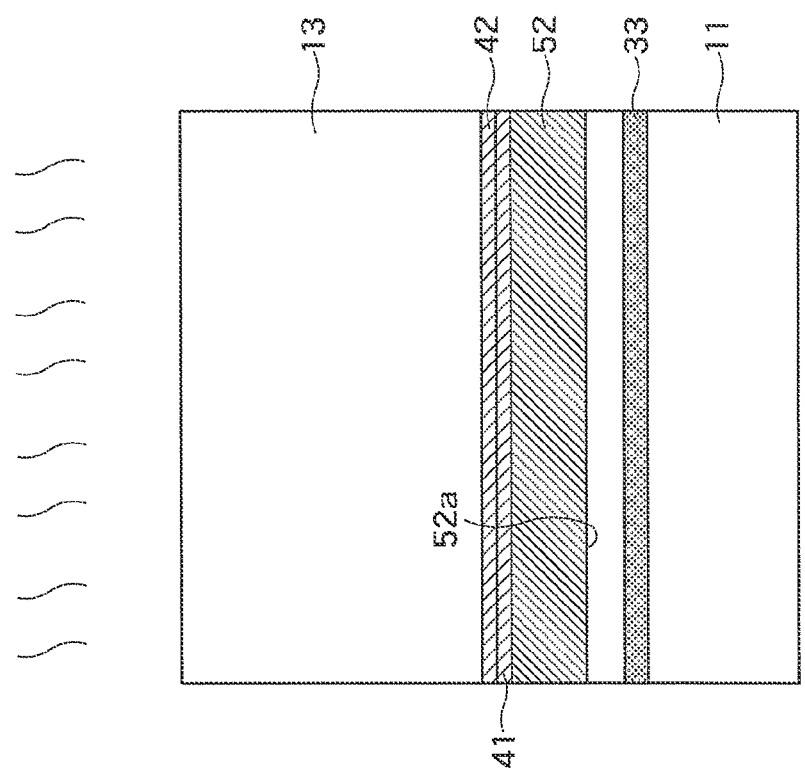
FIG. 2E
FIG. 2F

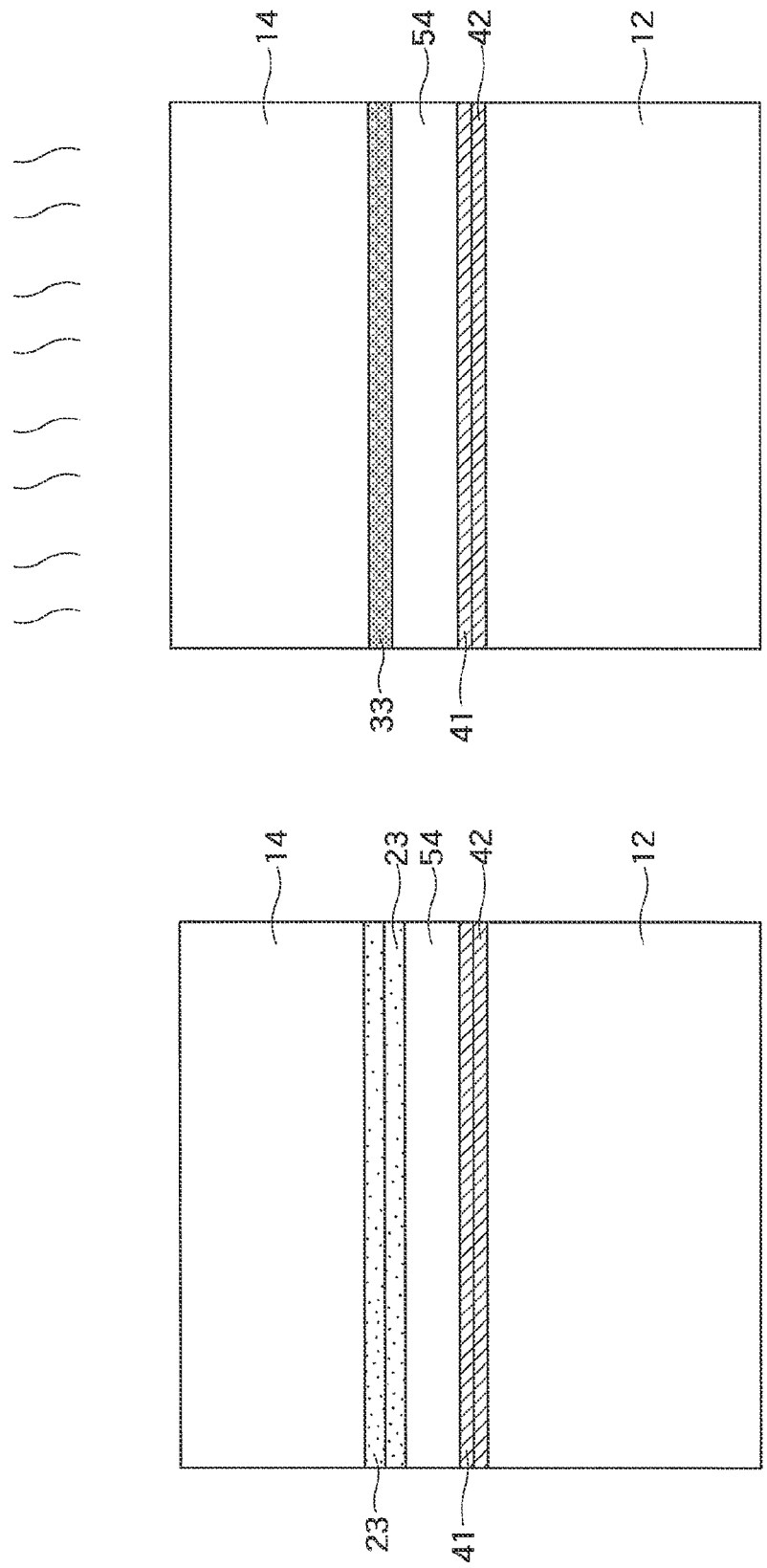

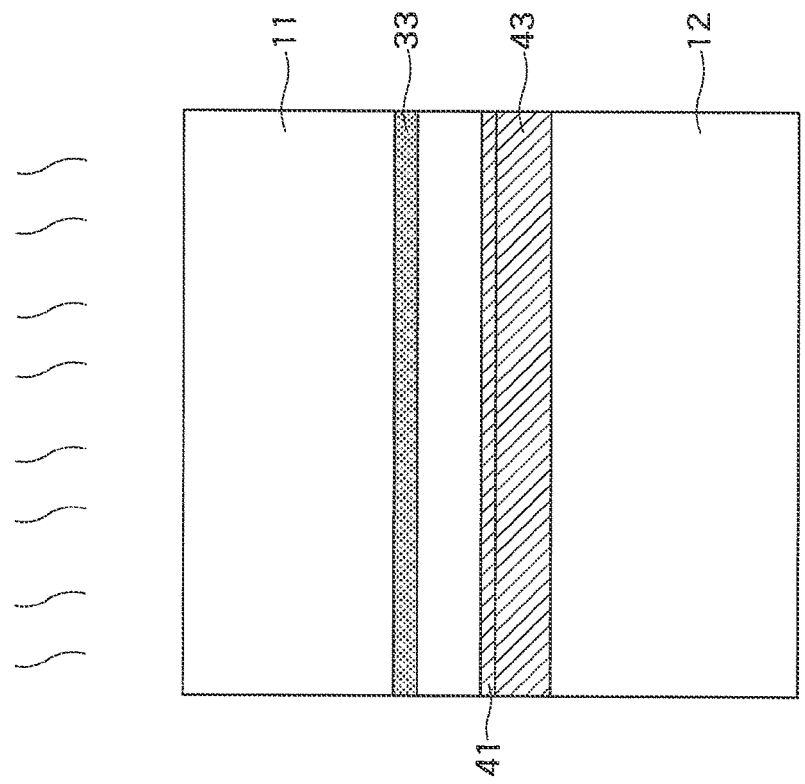
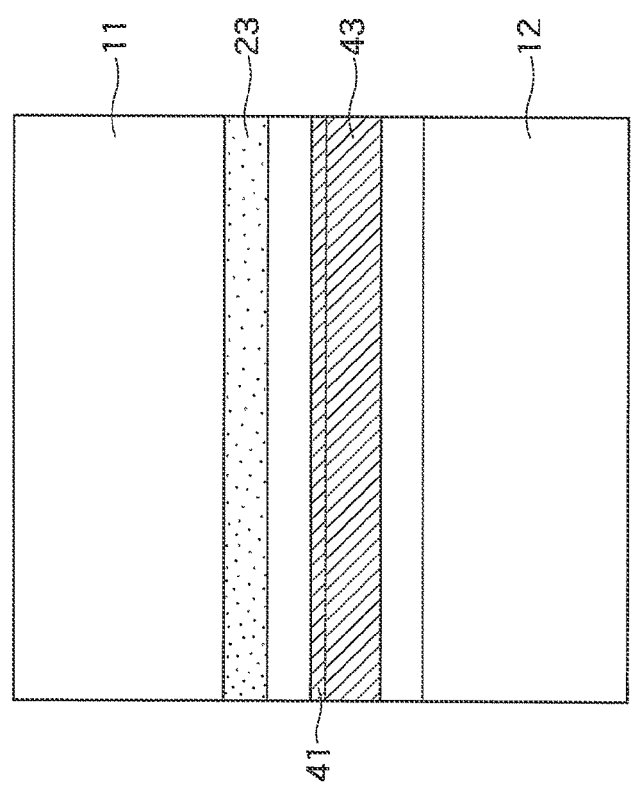

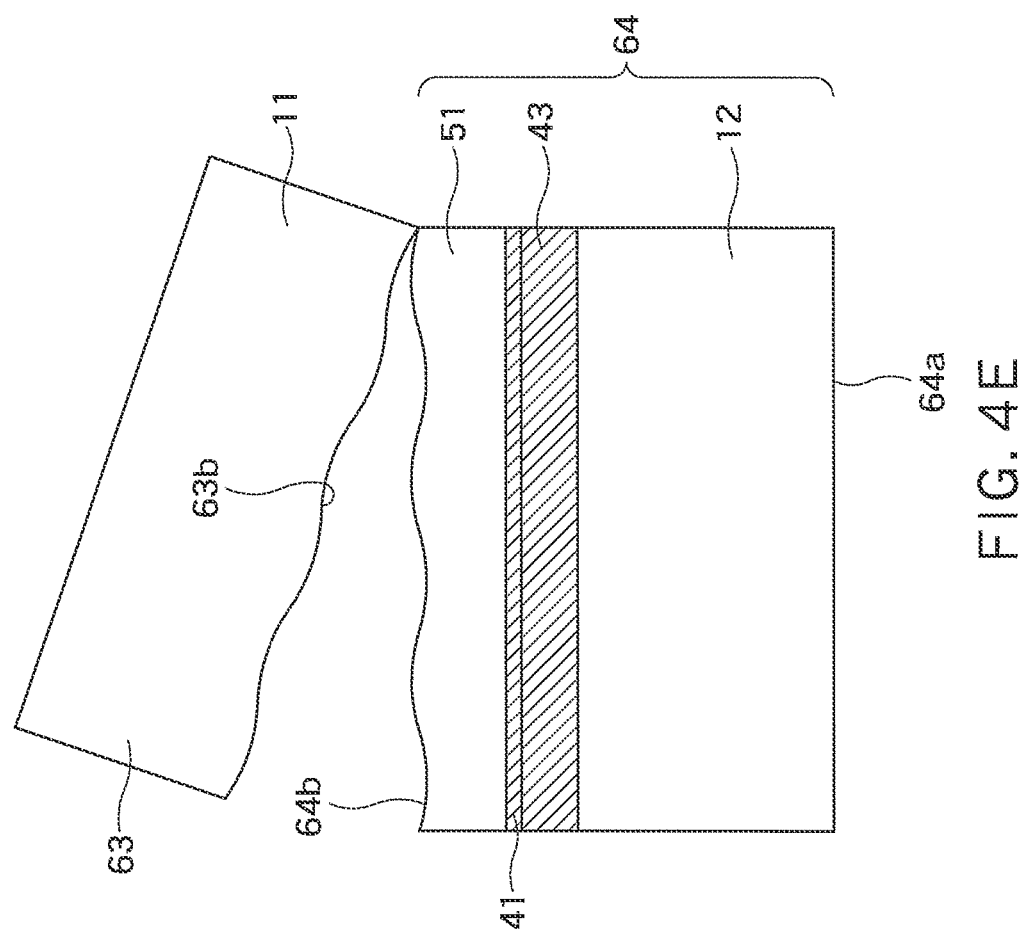

US 8,836,075 B2

SEMICONDUCTOR DEVICE AND FABRICATION METHOD THEREOF

CROSS-REFERENCE TO RELATED APPLICATION

This application is based upon and claims the benefit of priority from prior Japanese Patent Application No. 2011-205078, filed on Sep. 20, 2011, the entire contents of which are incorporated herein by reference.

FIELD

Embodiments of the present invention relate to a semiconductor device and a fabrication method thereof.

BACKGROUND

In recent years, a large-scale integrated circuit (LSI) formed in such a manner that many transistors and resistances are connected as an electric circuit and integrated on one chip has been frequently used for an important portion of computers and communication apparatuses. In particular, with regard to a semiconductor memory, the increase of memory capacity thereof is in demand in accordance with the expansion of application products. For example, a nonvolatile high-density semiconductor memory typified by a flash memory is used for an SD card, a USB memory and an SSD (Solid State Drive).

Such a nonvolatile high-density semiconductor memory is produced in the following manner. First, a memory device and a peripheral circuit are formed on a silicon semiconductor substrate. Next, the back surface of this silicon semiconductor substrate is shaved by mechanical polishing and Chemical Mechanical Polishing (CMP) to make the silicon semiconductor substrate into a thin layer. In addition, the thin-layered silicon semiconductor substrate is laminated by plurality and mounted.

In order to assure the reliability of such a high-density semiconductor memory, the impurity concentration such as metal, oxygen and carbon, and the density of crystal defects such as atomic vacancy and interstitial atoms in the silicon semiconductor substrate are controlled to a very small degree; such a silicon semiconductor substrate is produced by a semiconductor wafer maker as a high-quality silicon semiconductor substrate, which is expensive.

BRIEF DESCRIPTION OF THE DRAWINGS

FIGS. 1A to 1L are views for describing a fabrication method for a semiconductor device according to a first embodiment;

FIGS. 2A to 2F are views for describing a fabrication method for a semiconductor device according to a second embodiment;

FIGS. 3A to 3F are views for describing a fabrication method for a semiconductor device according to a third embodiment;

FIGS. 4A to 4E are views for describing a fabrication method for a semiconductor device according to a fourth embodiment.

DETAILED DESCRIPTION

Figure 1B:
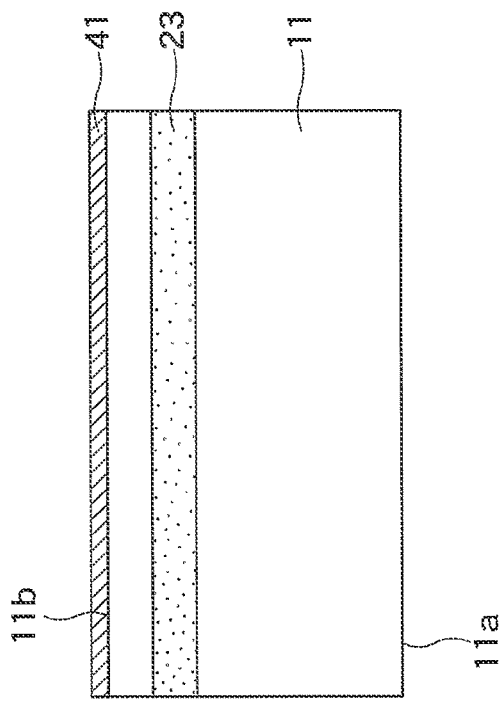

In one embodiment, a fabrication method for a semiconductor device includes: injecting an ion into a first substrate; joining the first substrate and a second substrate; irradiating a microwave to agglomerate the ion in a planar state in a desired position in the first substrate and form an agglomeration region spreading in a planar state; separating the second substrate provided with a part of the first substrate from the rest of the first substrate by exfoliating the joined first substrate from the second substrate in the agglomeration region; and grinding a part of the second substrate on a back surface opposite to an exfoliated surface in the second substrate provided with a part of the first substrate.

Hereafter, an embodiment will be described with reference to the drawings. However, the present invention is not limited to the embodiment. Common reference numbers will put on common portions over all of the drawings and redundant descriptions will not be repeated. In addition, the drawings are schematic views to promote explanation of the present invention and the understanding thereof, and the shapes, dimensions, and ratios thereof may be different from those of real devices. However, a design can be appropriately changed in consideration of the following explanation and a well-known technology.

First Embodiment

A fabrication method for a semiconductor device according to the embodiment of the present invention is hereinafter described by using FIGS. 1A to 1L showing a fabrication method for a semiconductor substrate of the present embodiment. Here, a fabrication method for a semiconductor device as a semiconductor memory is described as an example, and the present invention is not limited to such a semiconductor device but can be a semiconductor device such as an optical semiconductor element.

First, a high-quality silicon semiconductor substrate (a first substrate) 11 having silicon as the main component, such that at least one of oxygen concentration, carbon concentration, metal atom concentration and crystal defect concentration in the substrate is low, is prepared. Next, as shown in FIG. 1A, while cooling a back surface 11a of the high-quality silicon semiconductor substrate 11, a hydrogen ion with an energy of 280 keV or a helium ion with an energy of 770 keV is injected (doped) into the high-quality silicon semiconductor substrate 11 under the conditions of 1E16 to 1E17 cm$^{-2}$ (implanted dose) in the direction somewhat inclined (ranged from 5 to 10 degree) against the vertical direction of a top surface 11b of the high-quality silicon semiconductor substrate 11. Thus, an ion injection layer 23 is formed in a portion approximately 2.5 µm deep from the top surface 11b of the high-quality silicon semiconductor substrate 11. If the acceleration energy of the hydrogen ion reduced to 70 keV and implanted dose is 5E16 to 6E16 cm$^{-2}$, the hydrogen ion injection layer 23 is formed in a portion approximately 0.8 µm deep from the top surface 11b.

Figure 1A:
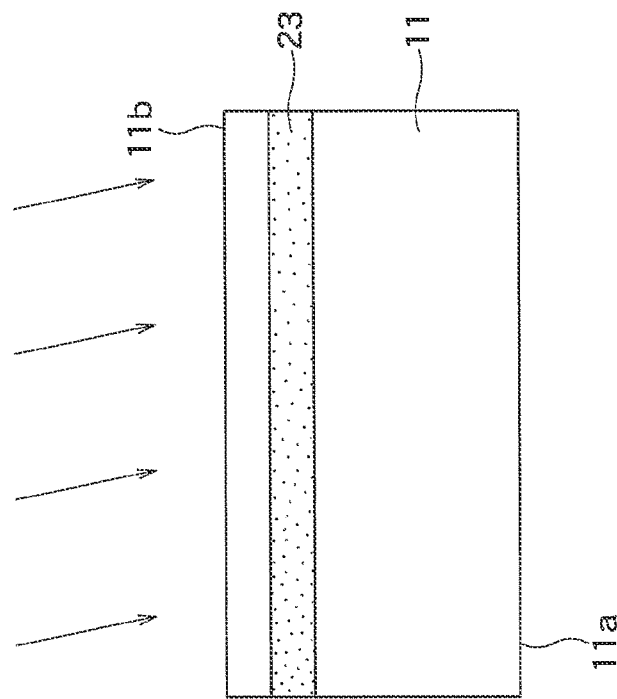

Subsequently, as shown in FIG. 1B, a silicon oxide film 41 as thin as a film thickness of approximately several nm is formed on the top surface 11b of the high-quality silicon semiconductor substrate 11, which is immersed in water or a medium containing water to terminate an OH group on the surface of the silicon oxide film 41.

Also, a low-quality silicon semiconductor substrate (a second substrate) 12 having silicon as the main component, such that at least one of oxygen concentration, carbon concentration, metal atom concentration and crystal defect concentration in the substrate is high as compared with the high-quality silicon semiconductor substrate 11, is prepared. Then, as shown in FIG. 1C, a thin silicon oxide film 42 is formed on a top surface 12b of the low-quality silicon semiconductor substrate 12 in the same manner as the formation of the silicon oxide film 41 described above, and the low-quality silicon semiconductor substrate 12 is immersed in water or a medium containing water to terminate an OH group on the surface of the silicon oxide film 42.

Next, as shown in FIG. 1D, the surface of the OH-terminated silicon oxide film 41 of the high-quality silicon semiconductor substrate 11 and the surface of the OH-terminated silicon oxide film 42 of the low-quality silicon semiconductor substrate 12 are superposed so that a crystal orientation such as <110> corresponds, and further heated at a low temperature of 200° C. or less. A water molecule is desorbed from OH groups on the surface of the silicon oxide films 41 and 42 by heating to join and integrate the high-quality silicon semiconductor substrate 11 and the low-quality silicon semiconductor substrate 12. On this occasion, as shown in FIG. 1D, the silicon oxide film 41 and the silicon oxide film 42 may partially remain without being reduced, or all of the silicon oxide film 41 and the silicon oxide film 42 can be reduced to a silicon layer by heating.

Then, as shown in FIG. 1E, the joined high-quality silicon semiconductor substrate 11 and low-quality silicon semiconductor substrate 12 are irradiated with a microwave. A hydrogen ion or a helium ion contained in the ion injection layer 23 is agglomerated in a planar state in a portion approximately 2.5 μm toward the back surface 11a of the high-quality silicon semiconductor substrate 11 from the top surface 11b of the high-quality silicon semiconductor substrate 11 by irradiating for approximately five minutes or more to form an agglomeration region (a fragile region) 33 in a planar state. On this occasion, the use of a microwave allows the high-quality silicon semiconductor substrate 11 to avoid being heated at high temperature, so that the injected hydrogen ion or helium ion can avoid diffusing in the upward and downward direction (the film thickness direction) in the high-quality silicon semiconductor substrate 11 to form the agglomeration region 33 in a thin planar state. Accordingly, thereafter, in exfoliating the joined high-quality silicon semiconductor substrate 11 from the low-quality silicon semiconductor substrate 12 in this agglomeration region 33, the agglomeration region 33 is so thin as to exfoliate (peel) easily and suppress the amount (the agglomeration region 33) of the high-quality silicon semiconductor substrate 11, which is wasted (lost) by exfoliation (peeling). The mechanism of the property of this microwave and the formation of the agglomeration region 33 in a planar state is described later. For easier exfoliation of the silicon semiconductor substrates, boron co-doping with hydrogen ion or helium ion into the ion injection layer 23 was found to be is effective. The concentration of boron is better to be 1E20 to 5E20 cm$^{-3}$. This phenomenon occurs because boron atoms can help the planar growth of voids (the agglomeration region (the fragile region) 33) in the plane parallel to the surfaces of the silicon semiconductor substrates and the boron co-doping can reduce the exfoliation time from 22000 sec to 400 sec at 360° C. and also reduced from 3000 sec to 150 sec at 470° C.

For details, the microwave to be irradiated is preferably a microwave with a frequency of more than 2.45 GHz and less than 50 GHz, more preferably a microwave with a frequency of 5.8 GHz or more and 30 GHz or less. A frequency band centering on 5.80 GHz is assigned to ISM (Industry-Science-Medical) band ((Industry-Science-Medical Band)), so that a magnetron is easily available.

Also, the power density of the microwave to be irradiated is determined so as to be 50 W to 1500 W per 1 cm$^2$, and it is desirable that the microwave is irradiated so as to maintain the high-quality silicon semiconductor substrate 11 and the low-quality silicon semiconductor substrate 12 at a substrate temperature of 300° C. or less, desirably 100° C. or less. In irradiating the microwave, cooling is performed as required. The cooling can restrain the high-quality silicon semiconductor substrate 11 and the low-quality silicon semiconductor substrate 12 from rising in temperature, and make the irradiation power of the microwave so higher as to bring out the effect of the microwave treatment further and form the agglomeration region 33 in a planar state more easily. Examples of a cooling method include a method for passing inert gas through the back surface 11a of the high-quality silicon semiconductor substrate 11 and/or a back surface 12a of the low-quality silicon semiconductor substrate 12.

The substrate temperature of the high-quality silicon semiconductor substrate 11 and the low-quality silicon semiconductor substrate 12 is measured by using a pyrometer through a glass fiber from the side of the back surface 11a of the high-quality silicon semiconductor substrate 11 and/or the back surface 12a of the low-quality silicon semiconductor substrate 12. For details, the temperature in the central portion or a region within 30 mm from the center of the back surface of these silicon semiconductor substrates is measured. Also, in the case where exact temperature measurement is necessary for process control, the measurement is performed in plural regions, such as the central portion, the outer periphery and the intermediate portion of the back surface of these silicon semiconductor substrates.

Next, as shown in FIG. 1F, the high-quality silicon semiconductor substrate 11 is exfoliated (peeled off) the low-quality silicon semiconductor substrate 12 in the agglomeration region 33 so that a silicon layer 51 with a thickness of approximately 2.5 μm on the side of the top surface 11b in the high-quality silicon semiconductor substrate 11 is left on the low-quality silicon semiconductor substrate 12. Accordingly, they are separated into two semiconductor substrates. For details, one semiconductor substrate is the low-quality silicon semiconductor substrate 12 having a part (the silicon layer 51) of the high-quality silicon semiconductor substrate 11, in other words, a semiconductor substrate 62 composed of a lamination having a part (the silicon layer 51) of the high-quality silicon semiconductor substrate 11 and the above-mentioned low-quality silicon semiconductor substrate 12. The other semiconductor substrate 63 is the rest of the high-quality silicon semiconductor substrate 11.

Figure 1H:
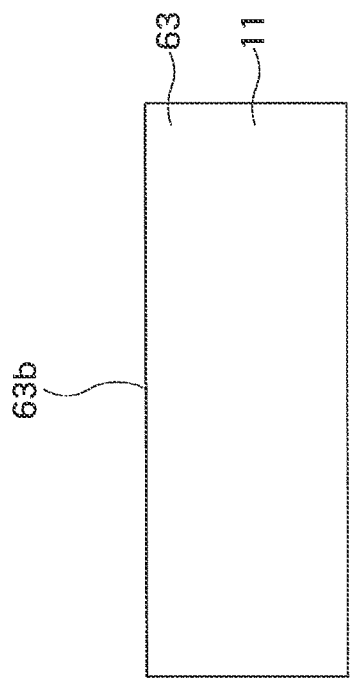
Figure 1G:
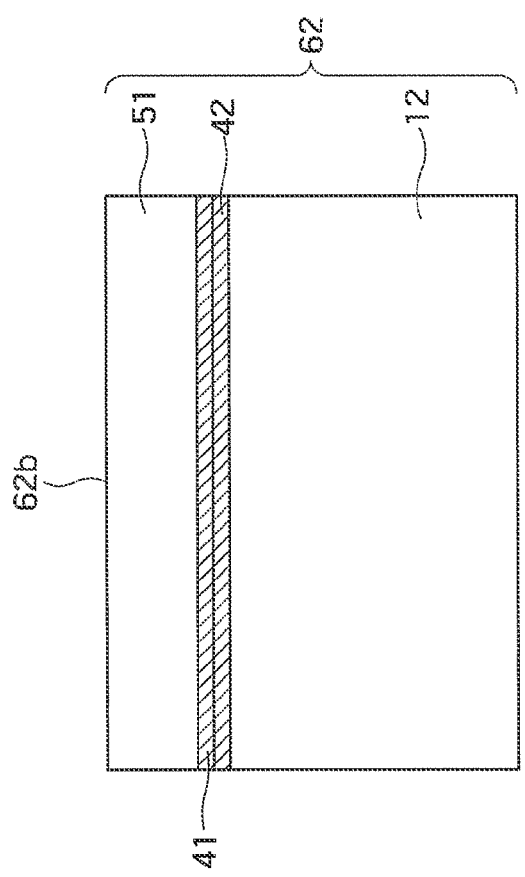

The surface of an exfoliated (peeled) surface 62b of the semiconductor substrate 62 formed by this exfoliation has such irregularities in an atomic level as to be flattened by a chemical polishing method, thereafter heated in an inert gas atmosphere containing hydrogen or vacuum, and treated so as to become a smooth surface by moving a silicon atom on the surface to form the semiconductor substrate 62 as shown in FIG. 1G.

In addition, as shown in FIG. 1H, the other semiconductor substrate 63 is also subject to flattening and smoothing treatment on an exfoliated surface 63b thereof, similarly to the above-mentioned semiconductor substrate 62.

Figures 1I, 1J:
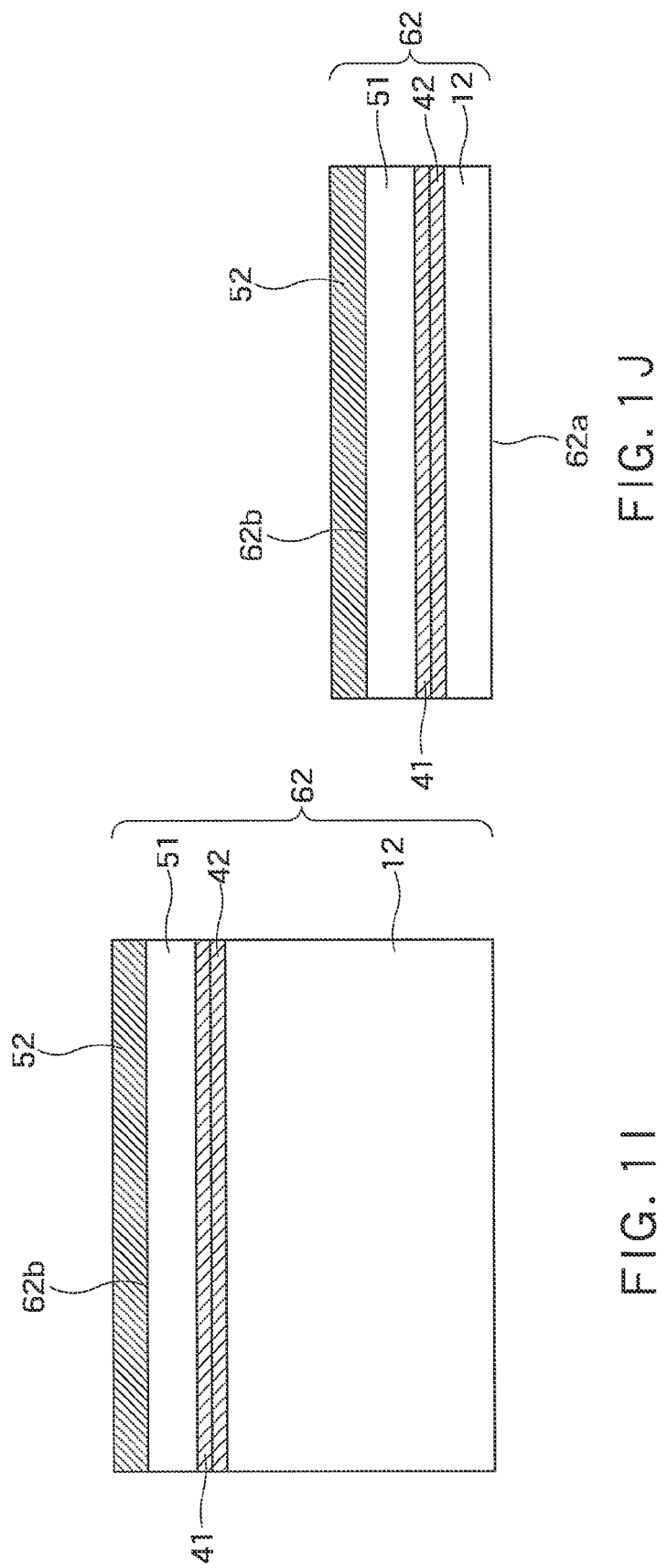

Thereafter, as shown in FIG. 1I, a semiconductor element such as a circuit and a wiring layer are formed on the smoothed exfoliated surface 62b of the semiconductor substrate 62. The thickness of an element forming region 52 with this semiconductor element formed is less than 20 μm, for example.

Then, a back surface 62a of the semiconductor substrate 62, opposite to the exfoliated surface 62b, is shaved by mechanical polishing and chemical mechanical polishing to make the semiconductor substrate 62 into a thin layer. Then, as shown in FIG. 1J, the semiconductor substrate 62 as a laminated structure having a layer (a first layer) 51 composed of the high-quality silicon semiconductor substrate 11 and a layer (a second layer) composed of the above-mentioned low-quality silicon semiconductor substrate 12 can be obtained. As understood from the above-mentioned description, a portion shaved for making into a thin layer in the semiconductor substrate 62 is composed of the low-quality silicon semiconductor substrate 12. Accordingly, the production costs can be reduced by reason of avoiding shaving off the expensive high-quality silicon semiconductor substrate 11 to shave off the inexpensive low-quality silicon semiconductor substrate 12.

As described above, in the case where all of the silicon oxide film 41 and the silicon oxide film 42 are reduced by heating in joining the high-quality silicon semiconductor substrate 11 and the low-quality silicon semiconductor substrate 12, the semiconductor substrate 62 as shown in FIG. 1K is formed finally (in the step corresponding to FIG. 1J).

The semiconductor substrate 62 according to the present embodiment can be produced by repeating the steps shown in FIGS. 1A to 1J again with the use of the semiconductor substrate 63 subject to flattening and smoothing treatment. The thickness of the semiconductor substrate 63 becomes thin by performing a series of these steps plural times; yet, as shown in FIG. 1L, the semiconductor substrate 63 can be returned to the same film thickness as the initial high-quality silicon semiconductor substrate 11 by making silicon into epitaxial growth on the top surface 63b of the semiconductor substrate 63 to form an epitaxial silicon layer 53. Thereafter, a series of these steps of the present embodiment can be performed again plural times. Thus, the semiconductor substrate 63 composed of the high-quality silicon semiconductor substrate 11 can be reused, and by extension, the reduction of the production costs and the reduction of the environmental load can be realized.

A conventional method by the inventors of the present invention is described as a comparative example for comparing with the present embodiment. In this method of the comparative example, in order to obtain a semiconductor substrate made into a thin layer, a high-quality silicon semiconductor substrate having an initial thickness of 780 μm is prepared, on whose top surface an element forming region having a thickness of 1 μl or less is formed, and next the back surface of the high-quality silicon semiconductor substrate, opposite to the element forming region, is made into a thin layer by grinding and polishing by 700 μm or more to finally obtain the semiconductor substrate having a thickness of 30 to 50 μm. That is to say, in the method of the comparative example, in order to obtain a semiconductor substrate made into a thin layer, most of the expensive high-quality silicon semiconductor substrate is wasted by grinding.

However, in the present embodiment, the agglomeration region 33 is formed in a planar state by using the microwave treatment to obtain the semiconductor substrate 62 by exfoliation in the agglomeration region 33, and additionally a portion composed of the low-quality silicon semiconductor substrate 12 is ground and polished in thereafter making the semiconductor substrate 62 into a thin layer, so that the expensive high-quality silicon semiconductor substrate 11 can avoid being wasted as much as possible. Accordingly, the reduction of the production costs can be realized. The left high-quality silicon semiconductor substrate 11 can be reused in the present embodiment, so that the reduction of the production costs and the further reduction of the environmental load can be realized.

Incidentally, the present embodiment utilizes the property of the microwave in forming the agglomeration region in a planar state. The property of the microwave is described below.

The microwave is one of electromagnetic waves. Accordingly, in the microwave, an electric field and a magnetic field exist so as to be vertical to each other in the traveling direction of the wave. Then, these electric field and magnetic field become the maximum at the spot where the wave offers the maximum amplitude and zero at the moment when the amplitude of the wave becomes zero.

Incidentally, when impurities and crystal defects (atomic vacancy, interstitial atom and unbound atom) exist in a silicon crystal, electric charge distribution occurs in the silicon crystal. In particular, in the case of impurities, the impurity atom and the silicon atom differ in electronegativity so much that an electron is leaning to an atom easily attracting an electron (negatively charged) while the other atom is in a state of being short of an electron (positively charged). Thus, an electric dipole is formed in the silicon crystal. Then, when the microwave is irradiated, this electric dipole vibrates in accordance with the electric field of the microwave. Therefore, this vibration becomes larger as the power of the microwave becomes larger.

In addition, the property of the microwave is further described while comparing with infrared rays used in heat treatment such as RTA (Rapid Thermal Annealing) and furnace annealing.

With regard to infrared rays, the wavelength thereof is as short as 10 μm and is as high a frequency as 30 THz in terms of frequency, so that the irradiation of infrared rays on the silicon crystal causes stretching vibration of bond between the adjacent silicon atoms in the silicon crystal and causes torsional vibration (rotation vibration) of bond between the silicon atoms with difficulty. Such stretching vibration does not cause the position of the silicon atoms to move largely, so that rearrangement of bond between the silicon atoms is caused with difficulty.

On the other hand, in the case of irradiating the microwave on the silicon crystal, the bond of four $Sp^3$ hybrid orbitals between the silicon atoms vibrates so as to be distorted, so that rearrangement of bond between the silicon atoms is efficiently caused. Also, the microwave is long in wavelength as compared with infrared rays and high in permeability into the silicon crystal. Accordingly, the microwave reaches a necessary spot efficiently.

However, 2.45 GHz as a frequency of a household microwave oven is so low that it is difficult to efficiently cause torsional vibration of bond between the silicon atoms. On the other hand, when the frequency exceeds 30 GHz, torsional vibration of bond between the silicon atoms begins to be incapable of following. Accordingly, when the frequency is determined at the intermediate range between these frequencies, such as 5.8 GHz, torsional vibration of bond between the silicon atoms is efficiently caused and rearrangement of the silicon atoms is easily caused efficiently.

Accordingly, the irradiation of the microwave with a frequency higher than 2.45 GHz and lower than 50 GHz causes torsional vibration in the dipole composed of a dangling bond formed by injecting a hydrogen ion or a helium ion, and causes rearrangement of the silicon atoms efficiently. Accordingly, rearrangement of the silicon atoms is selectively caused in the region with the ion injected, and the injected ion can be agglomerated in a planar state in a desired position of the high-quality silicon semiconductor substrate 11. In addition, the ion can be agglomerated so efficiently that the high-quality silicon semiconductor substrate 11 does not need to be heated up to high temperature. Accordingly, the ion diffuses with difficulty in the upward and downward direction (the film thickness direction) in the high-quality silicon semiconductor substrate 11, and diffuses in the lateral (right and left) direction parallel to the top surface 11b of the high-quality silicon semiconductor substrate 11, so that the agglomeration region 33 can be formed more thinly in a planar state. Accordingly, the ion is agglomerated in such a planar state as to easily exfoliate on the spot and suppress the amount (the agglomeration region 33) of the high-quality silicon semiconductor substrate 11, which is wasted (lost) by exfoliation.

In the present embodiment, a silicon substrate such that any of oxygen concentration, carbon concentration, metal atom concentration and crystal defect concentration in the substrate is high as compared with the high-quality silicon semiconductor substrate 11 is used as the low-quality silicon semiconductor substrate 12, which is not limited thereto and examples of an inexpensive substrate include a quartz substrate, a glass substrate, a graphite substrate, a stainless substrate, a plastic substrate, a polyimide substrate, and a PET (polyethylene terephthalate) substrate. In the present embodiment, heating to high temperature is so unnecessary during the processes that a substrate to be used is not limited, and an inexpensive substrate and a transparent substrate can be properly selected in accordance with uses.

In the description of the above-mentioned present embodiment, the joining of the high-quality silicon semiconductor substrate 11 and the low-quality silicon semiconductor substrate 12 is performed by making the silicon oxide film 41 and the silicon oxide film 42 intervene between these silicon semiconductor substrates to heat the films, and is not limited to such a method and can be also performed by using other methods. On this occasion, it is preferable to avoid applying high temperature to the high-quality silicon semiconductor substrate 11 and the low-quality silicon semiconductor substrate 12.

Examples of a joining method include a direct joining method. This method is performed in the following manner. The surfaces of the high-quality silicon semiconductor substrate 11 and the low-quality silicon semiconductor substrate 12 are treated with an acid aqueous solution and oxidized slightly to form a thin oxide film while terminating the surface of the oxide film with an OH group. In addition, these silicon semiconductor substrates are superposed and heated so that the oxide films face each other.

Also, other examples include a joining method by using resins and adhesive agents such as benzocyclobutene resin (BCB), polymethyl methacrylate (PMMA) and cycloolefin resin (COP).

In addition, examples include a method such that a metal film such as In, Sn, Cu and Au and low-melting Wood's metal (Wood's alloy) are formed on the surfaces of the high-quality silicon semiconductor substrate 11 and the low-quality silicon semiconductor substrate 12, which are superposed so that the above-mentioned metal films face each other, and joined by heating in an inert gas atmosphere or vacuum; and a method such that the surface of the silicon semiconductor substrates is activated by plasma treatment and joined.

Second Embodiment

In the first embodiment, a semiconductor element is formed after forming the semiconductor substrate 62; yet, the present embodiment differs from the first embodiment in forming the semiconductor substrate 62 by using the high-quality silicon semiconductor substrate 11 with a semiconductor element formed previously. In addition, the present embodiment differs also in replacing the low-quality silicon semiconductor substrate with an inexpensive support substrate, and the reduction of the production costs can be further intended.

A fabrication method for a semiconductor device according to the present embodiment is hereinafter described by using FIGS. 2A to 2F showing a fabrication method for a semiconductor device of the present embodiment. Here, the description is not repeated in common portions to the first embodiment.

First, a high-quality silicon semiconductor substrate 11 having an element forming region 52 with a thickness of less than 20 µm is prepared. A semiconductor element is formed in this element forming region 52. Then, as shown in FIG. 2A, similarly to the first embodiment, a hydrogen ion or a helium ion is injected into the high-quality silicon semiconductor substrate 11 to form an ion injection layer 23 in a portion approximately 2.5 µm deep from a back surface 52a of the element forming region 52.

Figure 2B:
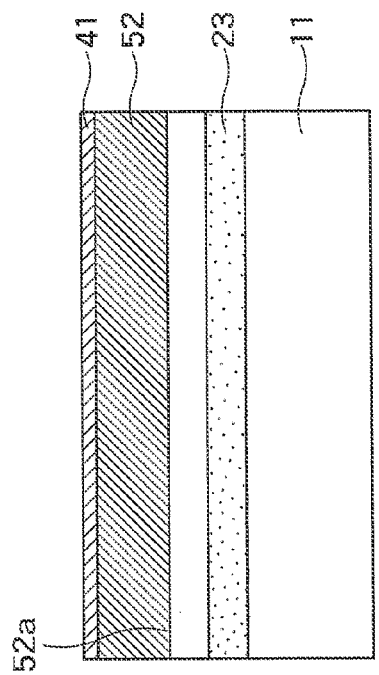
Figure 2A:
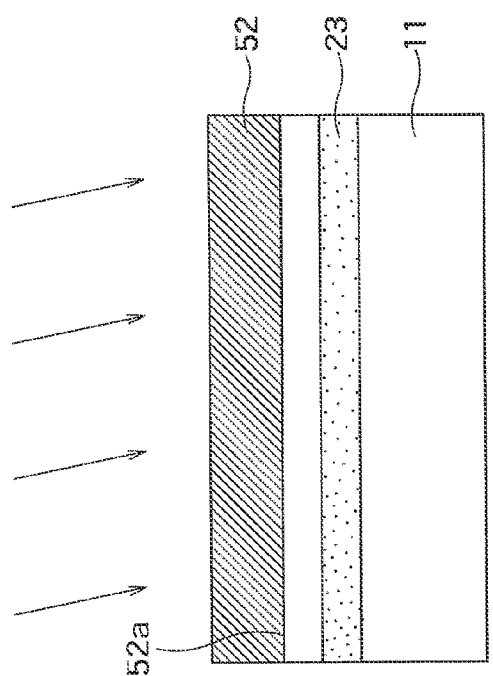

In addition, as shown in FIG. 2B, similarly to the first embodiment, a thin silicon oxide film 41 is formed on the element forming region 52, and the high-quality silicon semiconductor substrate 11 is immersed in water or a medium containing water to terminate an OH group on the surface of the silicon oxide film 41.

Next, a support substrate 13 is prepared. This support substrate 13 can be properly selected in accordance with uses and costs and is preferably a substrate close in coefficient of thermal expansion to silicon. Next, as shown in FIG. 2C, a thin silicon oxide film 42 is formed on this support substrate 13 similarly to the first embodiment, and the support substrate 13 is immersed in water or a medium containing water to terminate an OH group on the surface of the silicon oxide film 42.

Figure 2D:
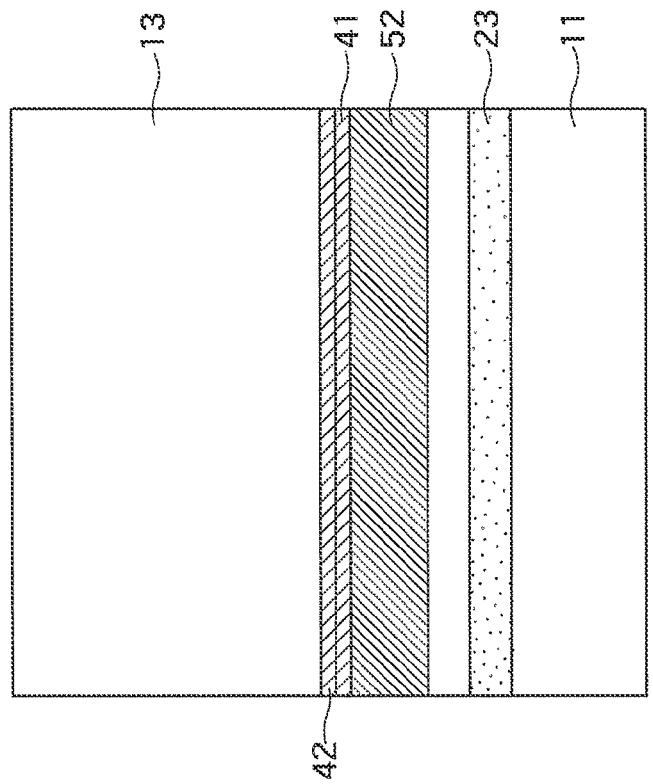
Figure 2C:
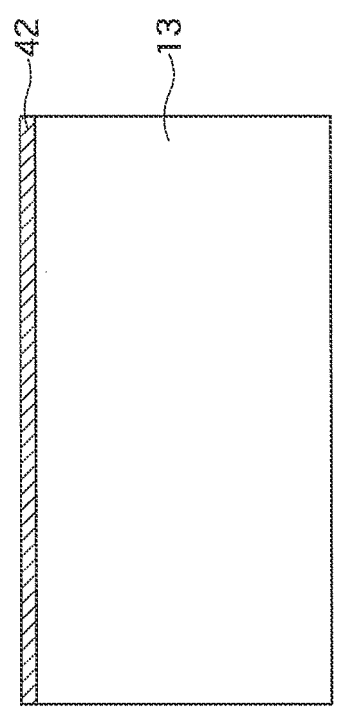

Next, as shown in FIG. 2D, similarly to the first embodiment, the surface of the OH-terminated silicon oxide film 41 of the high-quality silicon semiconductor substrate 11 with the ion injected and the surface of the OH-terminated silicon oxide film 42 of the support substrate 13 are superposed so that a crystal orientation such as <110> corresponds, and further heated at a low temperature of 200° C. or less. Thus, the high-quality silicon semiconductor substrate 11 and the support substrate 13 are joined and integrated.

Thereafter, as shown in FIG. 2E, the high-quality silicon semiconductor substrate 11 is irradiated with a microwave by using the same conditions as the first embodiment to agglomerate the ion contained in the ion injection layer 23 in a planar state in a portion approximately 2.5 µm deep from the under surface 52a of the element forming region 52 in the high-quality silicon semiconductor substrate 11. Thus, an agglomeration region 33 with the ion agglomerated is formed.

Then, as shown in FIG. 2F, the high-quality silicon semiconductor substrate 11 is exfoliated from the support substrate 13 in the agglomeration region 33 so that a silicon layer 51 with a thickness of approximately 2.5 µm on the side of the element forming region 52 in the high-quality silicon semiconductor substrate 11 and the element forming region 52 are left on the support substrate 13. Accordingly, they are separated into two semiconductor substrates. For details, one semiconductor substrate is a semiconductor substrate 62 having a part (the silicon layer 51) of the high-quality silicon semiconductor substrate 11, the support substrate 13 and the element forming region 52 located therebetween, and the other semiconductor substrate 63 is composed of the rest of the high-quality silicon semiconductor substrate 11. Thereafter, the illustration is omitted, and similarly to the first embodiment, flattening and smoothing treatment are performed for each of an exfoliated surface 62b of the semiconductor substrate 62 and an exfoliated surface 63b of the semiconductor substrate 63.

Then, the illustration is omitted, and similarly to the first embodiment, a back surface 62a of the semiconductor substrate 62, opposite to the exfoliated surface 62b, is shaved and planarized by mechanical polishing and chemical mechanical polishing to make the semiconductor substrate 62 into a thin layer. For larger wafer size such as 300 mm or larger in diameter, gas cluster ion beam using CO gas clusters or Ar gas clusters is effective in planarizing the whole wafer. Accordingly, a portion shaved for making into a thin layer is composed of the support substrate 13. Accordingly, in the case of using an inexpensive substrate as the support substrate 13, the production costs can be reduced for the reason that a portion to be wasted for making into a thin layer is composed of the support substrate 13.

Also, in the present embodiment, similarly to the first embodiment, the semiconductor substrate 62 of the present embodiment can be produced by reusing the semiconductor substrate 63 subject to flattening and smoothing treatment, that is, reusing the rest of the expensive high-quality silicon semiconductor substrate 11. In addition, similarly to the first embodiment, the semiconductor substrate 63 can be reused by making silicon into epitaxial growth on the semiconductor substrate 63 thinned by repeating reuse, so that the further reduction of the production costs and the reduction of the environmental load can be realized.

According to the present embodiment, the agglomeration region 33 is formed in a planar state by using the microwave treatment to obtain the semiconductor substrate 62 by exfoliation in the agglomeration region 33; additionally, a portion composed of the inexpensive support substrate 13 is ground and polished in thereafter making the semiconductor substrate 62 into a thin layer, so that the reduction of the production costs can be realized. The left high-quality silicon semiconductor substrate 11 can be reused in the present embodiment, so that the reduction of the production costs and the reduction of the environmental load can be realized.

Third Embodiment

In the first and second embodiments described above, the semiconductor substrate 62 is formed by using the high-quality silicon semiconductor substrate 11; yet, the present embodiment differs in replacing the high-quality silicon semiconductor substrate 11 with a silicon semiconductor substrate 14 containing boron or carbon at high concentration to form an epitaxial silicon layer 54 low in boron concentration or carbon concentration or an epitaxial silicon layer 54 containing no impurities on the silicon semiconductor substrate 14. This allows the agglomeration region 33 in a planar state to be formed more easily and the production costs to be reduced.

A fabrication method for a semiconductor device according to the present embodiment is hereinafter described by using FIGS. 3A to 3F showing a fabrication method for a semiconductor device of the present embodiment. Here, the description is not repeated in common portions to the first embodiment.

First, the silicon semiconductor substrate 14 containing impurities such as boron or carbon with the concentration ranged from 1E20 to 5E20 $cm^{-3}$ is prepared. This silicon semiconductor substrate 14 contains these impurities at a concentration of 1E20 $cm^{-3}$ or more. Next, as shown in FIG. 3A, an epitaxial silicon layer 54 lower in boron concentration or carbon concentration than the silicon semiconductor substrate 14 or an epitaxial silicon layer 54 containing none of these impurities is formed on the silicon semiconductor substrate 14 so as to have a film thickness of approximately 2 to 3 μm.

Figure 3B:
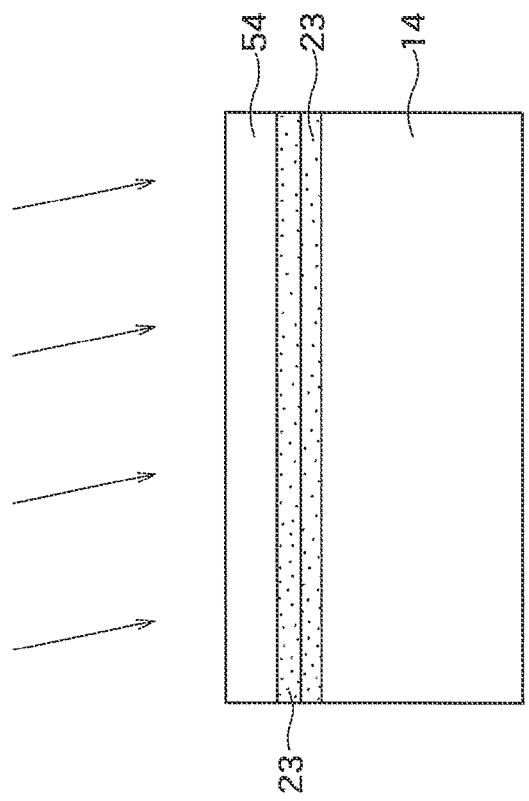
Figure 3A:
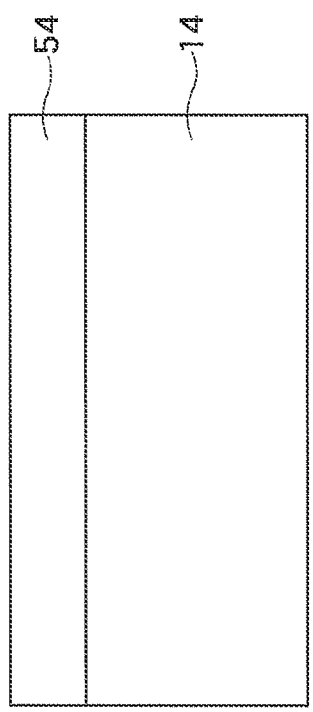

Next, as shown in FIG. 3B, a hydrogen ion or a helium ion is injected into the neighborhood of a boundary between the silicon semiconductor substrate 14 and the epitaxial silicon layer 54 on the same conditions as the first embodiment to form an ion injection layer 23.

Figure 3C:
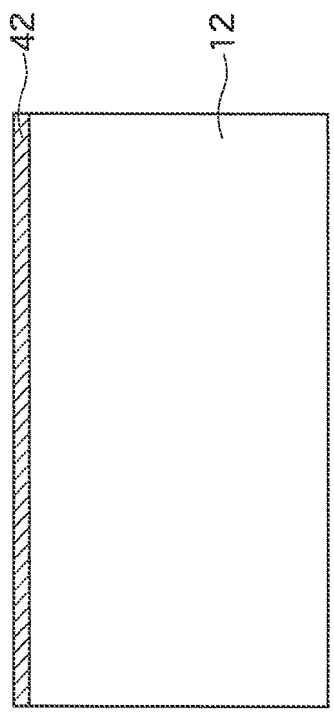

Then, as shown in FIG. 3C, similarly to the first embodiment, a thin silicon oxide film 41 is formed on the silicon semiconductor substrate 14, which is immersed in a medium to terminate an OH group on the surface of the silicon oxide film 41.

Figure 3D:
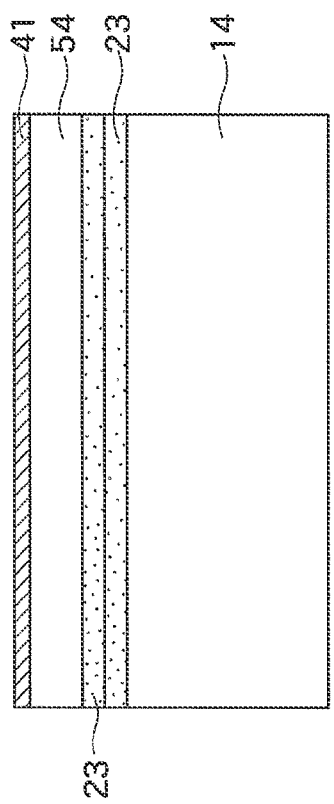

Also, as shown in FIG. 3D, similarly to the first embodiment, a low-quality silicon semiconductor substrate 12 is prepared and a thin silicon oxide film 42 is formed on the low-quality silicon semiconductor substrate 12, which is immersed in a medium to terminate an OH group on the surface of the silicon oxide film 42.

Next, as shown in FIG. 3E, similarly to the first embodiment, the surface of the silicon oxide film 41 of the silicon semiconductor substrate 14 and the surface of the silicon oxide film 42 of the low-quality silicon semiconductor substrate 12 are superposed so that a crystal orientation corresponds, and further heated at a low temperature of 200° C. or less. The silicon semiconductor substrate 14 and the low-quality silicon semiconductor substrate 12 are joined and integrated by heating.

In addition, as shown in FIG. 3F, the joined silicon semiconductor substrate 14 and low-quality silicon semiconductor substrate 12 are irradiated with a microwave on the same conditions as the first embodiment. An ion contained in the ion injection layer 23 is agglomerated in a planar state in the neighborhood of a boundary between the silicon semiconductor substrate 14 and the epitaxial silicon layer 54 by irradiating for approximately five minutes or more to form an agglomeration region 33. In the case of agglomerating the ion by using a microwave, the ion is agglomerated more easily in a region in which the impurities exist at a high concentration of 1E20 $cm^{-3}$ or more; accordingly, the agglomeration region 33 can be formed more easily. This mechanism is described later.

Thereafter, the illustration is omitted, and similarly to the first embodiment, the silicon semiconductor substrate 14 is exfoliated form the low-quality silicon semiconductor substrate 12 in the agglomeration region 33 to form a semiconductor substrate 63 composed of the silicon semiconductor substrate 14 and a semiconductor substrate 62 having the low-quality silicon semiconductor substrate 12 and the epitaxial silicon layer 54. A semiconductor element can be formed in this epitaxial silicon layer 54. Subsequently, flattening and smoothing treatment are performed for each exfoliated surface of the semiconductor substrates 62 and 63 to further form an element forming region 52 on the semiconductor substrate 62. Then, similarly to the first embodiment, the back surface opposite to the exfoliated surface of the semiconductor substrate 62 is shaved by mechanical polishing and chemical mechanical polishing to make the semiconductor substrate 62 into a thin layer. This portion shaved for making into a thin layer is composed of the low-quality silicon semiconductor substrate 12.

Also, in the present embodiment, in order to realize the reduction of the production costs and the reduction of the environmental load, similarly to the first embodiment, the semiconductor substrate 62 of the present embodiment can be produced by reusing the semiconductor substrate 63 subject to flattening and smoothing treatment. In addition, similarly to the first embodiment, the semiconductor substrate 63 can be reused by making silicon into epitaxial growth on the semiconductor substrate 63 thinned by repeating reuse.

In the present embodiment, the ion is agglomerated by using a microwave in a region in which the impurities exist at high concentration, so that the agglomeration region 33 in a planar state can be formed more easily to obtain the semiconductor substrate 62 by exfoliation in the agglomeration region 33; additionally, the low-quality silicon semiconductor substrate 12 is ground and polished in thereafter making the semiconductor substrate 62 into a thin layer, so that the reduction of the production costs can be realized. The left silicon semiconductor substrate 14 can be reused in the present embodiment, so that the reduction of the production costs and the reduction of the environmental load can be realized.

Incidentally, in the present embodiment, the ion is agglomerated in a more planar state in a region in which the impurities exist at high concentration by utilizing the property of a microwave. The property of the microwave is hereinafter described. For details, as described above, when impurities exist in a silicon crystal, the impurity atom and the silicon atom differ in electronegativity so much that an electron is leaning to an atom easily attracting an electron while the other atom is in a state of being short of an electron, and an electric dipole is formed in the silicon crystal. In the present embodiment, a region in which the impurities exist at high concentration is formed, whereby many electric dipoles can be generated in this region. In addition, when the microwave is irradiated, many electric dipoles vibrate so particularly in the region thereof that the ion injected into this region or the neighborhood thereof can be effectively agglomerated in a planar state in this region.

In the present embodiment, a semiconductor substrate formed in the following manner can be used instead of using the above-mentioned silicon semiconductor substrate 14 containing boron or carbon at high concentration. First, a silicon semiconductor substrate such that the concentration of p-type or n-type impurities is 1E15 to 1E16 cm$^{-3}$ is prepared. Next, a divalent boron ion (B++) is injected into a region located in desired depth from the top surface of this silicon semiconductor substrate at an energy of 650 keV on the conditions of 1E15 to 1E16 cm$^{-2}$ (1E20 to 5E20 cm$^{-3}$) to form the silicon semiconductor substrate containing boron at high concentration.

Also, in the present embodiment, similarly to the embodiments described above, the support substrate 13 used in the second embodiment can be used instead of the low-quality silicon semiconductor substrate 12.

Also, the silicon semiconductor substrate 14 containing impurities at high concentration is not limited to a silicon substrate and can be another substrate. In this case, the composition of an epitaxial layer formed on the substrate can be modified in accordance with a material for the substrate.

Fourth Embodiment

The present embodiment is such as to produce an SOI (Silicon on Insulator) substrate having a silicon oxide film with desired thickness.

A fabrication method for a semiconductor device according to the present embodiment is hereinafter described by using FIGS. 4A to 4E showing a fabrication method for a semiconductor device of the present embodiment. Here, the description is not repeated in common portions to the first embodiment.

Similarly to the first embodiment, a high-quality silicon semiconductor substrate 11 and a low-quality silicon semiconductor substrate 12, such that at least one of oxygen concentration, carbon concentration, metal atom concentration and crystal defect concentration in the substrate is high as compared with the high-quality silicon semiconductor substrate 11, are prepared. Then, similarly to the first embodiment, as shown in FIG. 4A, a silicon oxide film 43 with a desired film thickness of 100 nm to 300 nm is formed on the top surface of the low-quality silicon semiconductor substrate 12. In addition, the low-quality silicon semiconductor substrate 12 is immersed in water or a medium containing water to terminate an OH group on the surface of the silicon oxide film 43.

Next, similarly to the first embodiment, a hydrogen ion or a helium ion is injected into the high-quality silicon semiconductor substrate 11 to prepare the high-quality silicon semiconductor substrate 11 such that an ion injection layer 23 is formed in a portion 10 nm to 10 μm deep from a top surface 11b thereof.

Figure 4B:
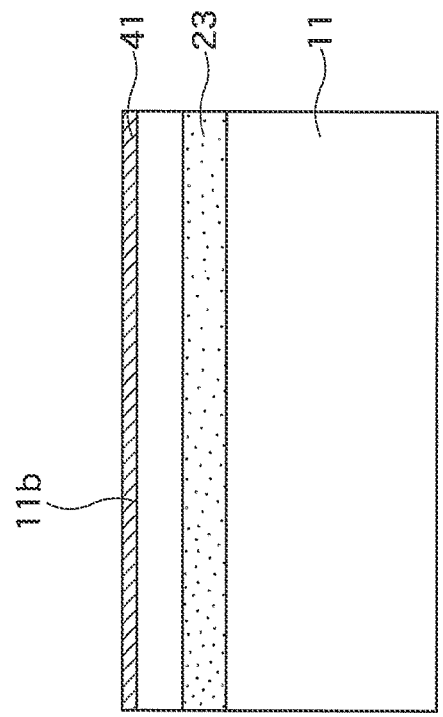
Figure 4A:
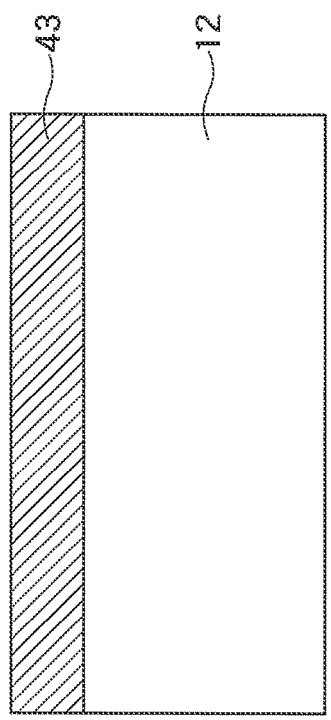

Then, as shown in FIG. 4B, a thin silicon oxide film 41 is formed on the top surface 11b of the high-quality silicon semiconductor substrate 11, which is immersed in water or a medium containing water to terminate an OH group on the surface of the silicon oxide film 41.

In addition, as shown in FIG. 4C, similarly to the first embodiment, the surface of the silicon oxide film 41 of the high-quality silicon semiconductor substrate 11 and the surface of the silicon oxide film 43 of the low-quality silicon semiconductor substrate 12 are superposed so that a crystal orientation corresponds, and heated at low temperature. The high-quality silicon semiconductor substrate 11 and the low-quality silicon semiconductor substrate 12 are joined and integrated by heating.

Thereafter, as shown in FIG. 4D, similarly to the first embodiment, the ion contained in the ion injection layer 23 is agglomerated in a planar state by irradiating a microwave to form an agglomeration region 33 for exfoliation. Also in this case, similarly to the embodiments described above, the ion can be agglomerated in a planar state by using a microwave.

Then, as shown in FIG. 4E, the high-quality silicon semiconductor substrate 11 is exfoliated from the low-quality silicon semiconductor substrate 12 in the agglomeration region 33 so that a silicon layer 51 with a thickness of 10 nm to 10 μm on the side of the silicon oxide film 41 in the high-quality silicon semiconductor substrate 11 is left on the silicon oxide film 43. Accordingly, they are separated into two semiconductor substrates. For details, one semiconductor substrate is an SOI substrate 64 having the low-quality silicon semiconductor substrate 12, a part (the silicon layer 51) of the high-quality silicon semiconductor substrate 11 with a thickness of 10 nm to 10 μm, and the silicon oxide film 43 with desired thickness located therebetween, and the other semiconductor substrate 63 is composed of the rest of the high-quality silicon semiconductor substrate 11. Similarly to the embodiments described above, a semiconductor element can be formed in a part (the silicon layer 51) of the high-quality silicon semiconductor substrate 11.

Thereafter, the illustration is omitted, and similarly to the first embodiment, flattening and smoothing treatment are performed for an exfoliated surface 64b of the SOI substrate 64 and an exfoliated surface 63b of the semiconductor substrate 63. Then, similarly to the first embodiment, a back surface 64a of the SOI substrate 64, opposite to the exfoliated surface 64b, is shaved by mechanical polishing and chemical mechanical polishing to make the SOI substrate 64 into a thin layer. A portion shaved for making into a thin layer in the SOI substrate 64 is composed of the low-quality silicon semiconductor substrate 12.

Also, in the present substrate, similarly to the first embodiment, the SOI substrate 64 of the present embodiment can be produced by reusing the semiconductor substrate 63 subject to flattening and smoothing treatment. In addition, similarly to the first embodiment, the semiconductor substrate 63 can be reused by making silicon into epitaxial growth on the semiconductor substrate 63 thinned by repeating reuse, so that the reduction of the production costs and the reduction of the environmental load can be realized.

According to the present embodiment, in fabricating the SOI substrate 64, the agglomeration region 33 is formed in a planar state by using the microwave treatment to obtain the SOI substrate 64 by exfoliation in the agglomeration region 33; additionally, a portion composed of the low-quality silicon semiconductor substrate 12 is ground and polished in thereafter making the SOI substrate 64 into a thin layer, so that the reduction of the production costs can be realized. The left high-quality silicon semiconductor substrate 11 can be reused in the present embodiment, so that the reduction of the production costs and the reduction of the environmental load can be realized.

In the present embodiment, a SiGe substrate and a Ge substrate can be used instead of the high-quality silicon semiconductor substrate 11 made of silicon.

Fifth Embodiment

In first to fourth embodiments described above, two semiconductor substrates are obtained in such a manner that the ion injection layer 23 is formed and subsequently the ion is agglomerated by irradiating a microwave to form the agglomeration region 33, in which the exfoliation is performed; yet, the present embodiment differs in forming an epitaxial layer made of SiGe instead of the agglomeration region 33 to separate into two semiconductor substrates by selectively removing this epitaxial layer.

A fabrication method for a semiconductor device according to the present embodiment is hereinafter described by using FIGS. 5A to 5F showing a fabrication method for a semiconductor device of the present embodiment. Here, the description is not repeated in common portions to the first embodiment.

First, a silicon semiconductor substrate 15 such that a crystal orientation is <100>, <110> or <111> is prepared. Then, as shown in FIG. 5A, a $SiGe_x$ layer (a first epitaxial layer) 55 such that the concentration (X) of germanium (Ge) is approximately 20% or more is subject to epitaxial growth on the silicon semiconductor substrate 15. For details, the $SiGe_x$ layer 55 with a film thickness of 1 to 10 μm is subject to epitaxial growth on the conditions of a substrate temperature of 500° C. or more by a CVD (Chemical Vapor Deposition) method with the use of gas composed of silicon hydride such as $SiH_4$ and gas composed of germanium hydride such as $GeH_4$. In the case of attempting to form the $SiGe_x$ layer 55 such that the concentration of Ge is 25% or more, in order to avoid causing stacking fault in the $SiGe_x$ layer 55, the $SiGe_x$ layer 55 is preferably formed so that the germanium concentration rises toward the upper layer from the silicon semiconductor substrate 15 side as a ground, in other words, the $SiGe_x$ layer 55 is preferably subject to epitaxial growth so as to offer concentration gradient of germanium in the film thickness direction of the $SiGe_x$ layer 55.

Figure 5B:
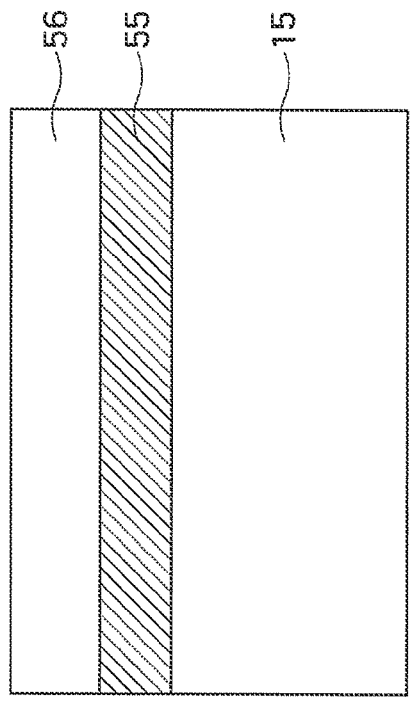
FIGS. 5A to 5F are views for describing a fabrication method for a semiconductor device according to a fifth embodiment.
Figure 5A:
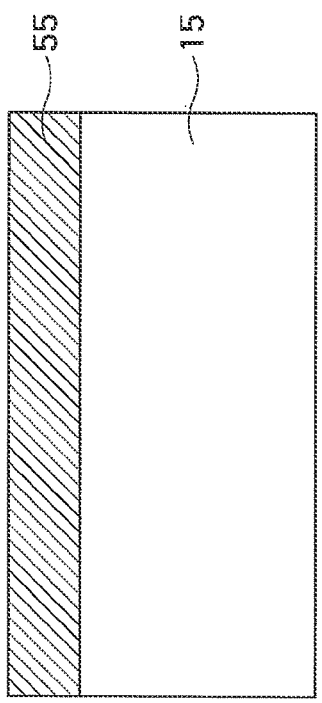

Next, as shown in FIG. 5B, an epitaxial silicon layer (a second epitaxial layer) 56 with a film thickness of 1 to 10 μm is subject to epitaxial growth on the $SiGe_x$ layer 55. The silicon layer is obtained by epitaxial growth on the $SiGe_x$ layer 55 by epitaxial growth, so that the epitaxial silicon layer 56 has favorable crystallinity. The formation in this manner allows the interface between the $SiGe_x$ layer 55 and the epitaxial silicon layer 56 to be flattened.

When the $SiGe_x$ layer 55 is exposed to the air, a natural oxide film is formed on the surface thereof, and the step of removing the natural oxide film on the surface of the $SiGe_x$ layer 55 is so necessary before forming the epitaxial silicon layer 56 that it is desirable that the $SiGe_x$ layer 55 and the epitaxial silicon layer 56 are continuously formed in different film forming chambers in the same apparatus or the same system without being exposed to the air.

Figure 5D:
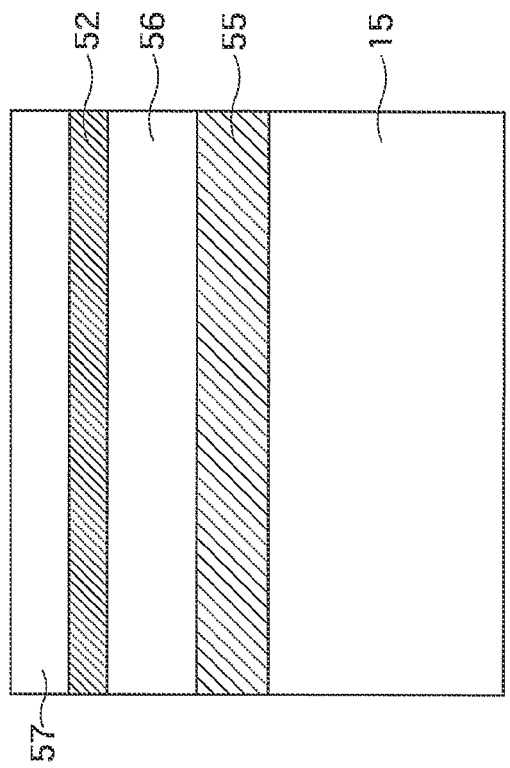
Figure 5C:
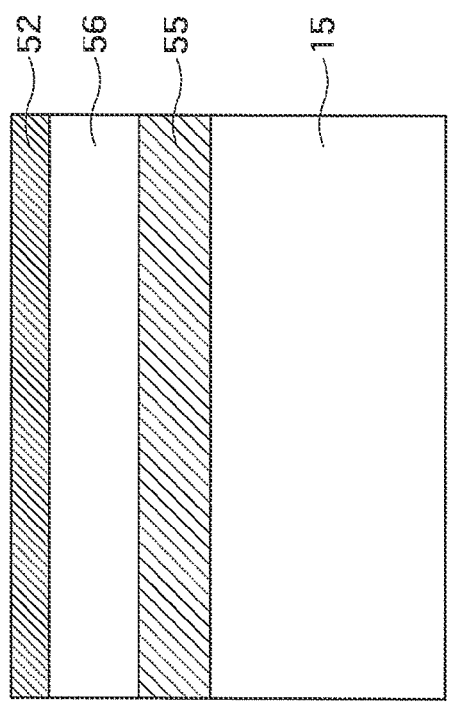

Then, as shown in FIG. 5C, an element forming region 52 including a semiconductor element such as a memory device and a LOGIC device and a wiring layer is formed on the surface of the epitaxial silicon layer 56.

In addition, as shown in FIG. 5D, a protective film 57 for covering the element forming region 52 is formed. This protective film 57 is made of an oxide film and resin.

Figure 5F:
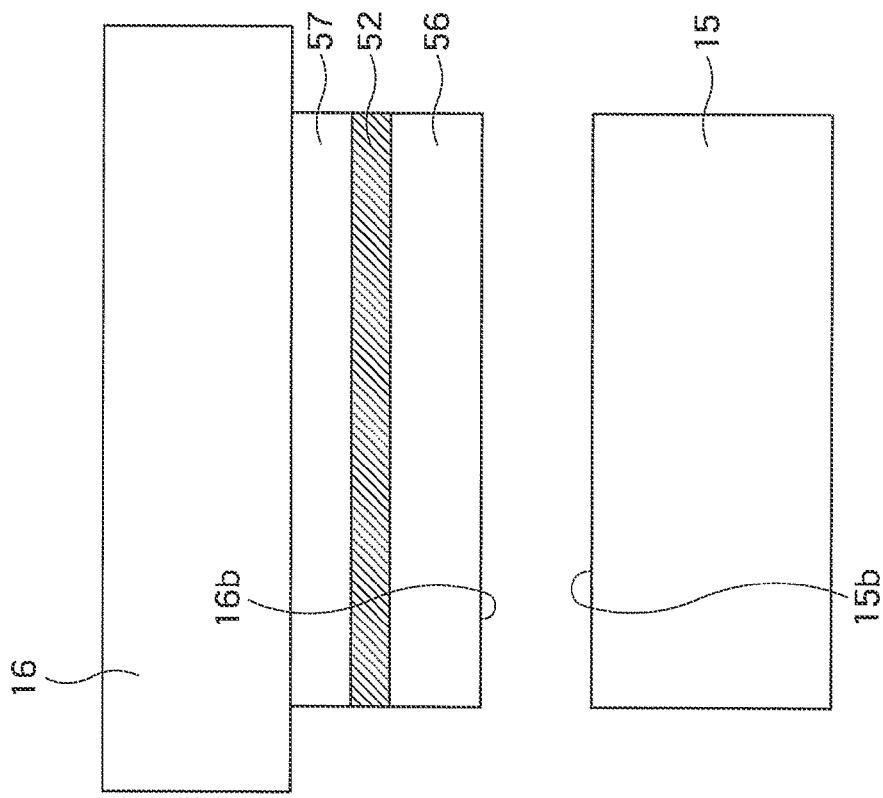
Figure 5E:
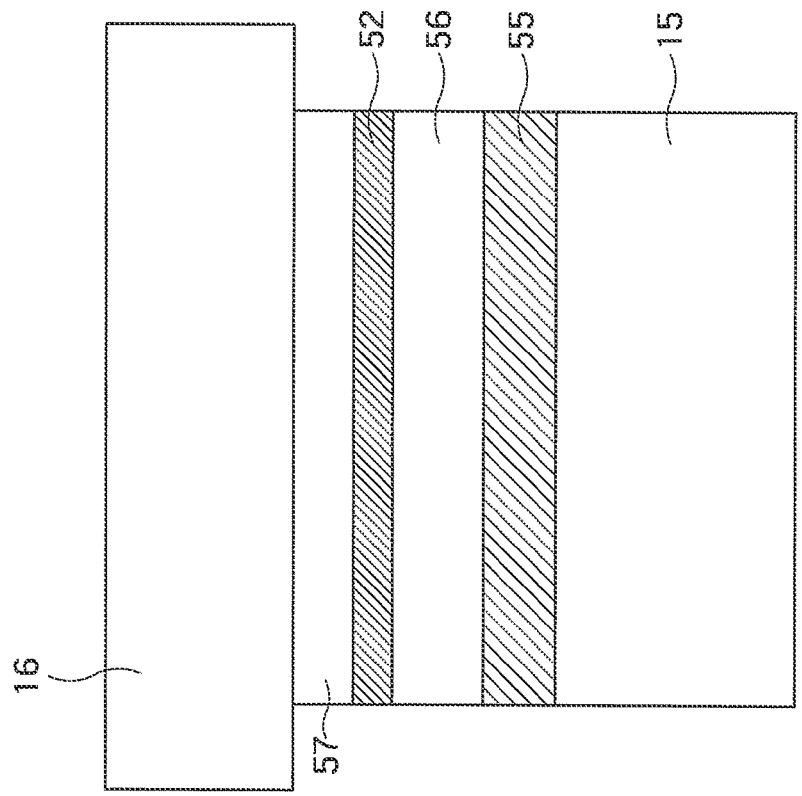

Next, resin such as polyimide is sprayed or applied on the surface of the protective film 57 to bond a support substrate 16 thicker than the film thickness of the epitaxial silicon layer 56 on the protective film 57, as shown in FIG. 5E. This support substrate 16 is preferably an inexpensive substrate, which is made of plastics, polyimide, PET, glass, quartz and resin, for example. In the present embodiment, heating to high temperature is so unnecessary that a support substrate to be used is not limited and can be properly selected in accordance with uses.

Then, the $SiGe_x$ layer 55 is sprayed with hydrogen chloride gas or mixed liquid of alkaline solution such as choline and aqueous hydrogen peroxide, and selectively removed by etching. The $SiGe_x$ layer 55 is so uniform a crystal layer by reason of being obtained by epitaxial growth that the residue remains with such difficulty in etch removal as to remove the $SiGe_x$ layer 55 with favorable repeatability. Thus, as shown in FIG. 5F, they are separated into two semiconductor substrates in the $SiGe_x$ layer 55. For details, one semiconductor substrate is the support substrate 16 having the epitaxial silicon layer 56, the element forming region 52 and the protective film 57, and the other semiconductor substrate is the silicon semiconductor substrate 15.

Thereafter, the illustration is omitted, and similarly to the first embodiment, flattening and smoothing treatment are performed for a separated surface 16b of the support substrate 16 and a separated surface 15b of the silicon semiconductor substrate 15. In addition, as required, this support substrate 16 can be made into a thin layer by grinding, or removed.

In the case where a laminated body thus obtained, composed of the epitaxial silicon layer 56, the element forming region 52, the protective film 57 and the support substrate 16, is mounted on a storage medium system, TSV (Through-Silicon Via) can be formed after the above-mentioned step and mounted on another semiconductor substrate.

Also, in the present embodiment, similarly to the first embodiment, the laminated body composed of the epitaxial silicon layer 56, the element forming region 52, the protective film 57 and the support substrate 16 can be produced by repeating the steps shown in FIGS. 5A to 5F again with the use of the silicon semiconductor substrate 15 subject to flattening and smoothing treatment. Accordingly, the reduction of the production costs and the reduction of the environmental load can be realized. The epitaxial layer to be selectively removed is not limited to the SiGe$_x$ layer, and the composition thereof can be properly selected in accordance with a substrate to be used.

According to the present embodiment, the epitaxial layer 55 made of SiGe is formed and selectively removed; thereby, two semiconductor substrates can be separated into two substrates with favorable repeatability so more easily that the reduction of the production costs can be realized. Also, in the present embodiment, the silicon layer is obtained by epitaxial growth on the SiGe layer 55 by epitaxial growth, so that the epitaxial silicon layer 56 can have favorable crystallinity.

In first to fifth embodiments described above, the silicon semiconductor substrate is not limited to a substrate made of silicon, and can be other substrates such as an SiGe substrate, a Ge substrate, an SiC substrate, a GaAs substrate, a GaN substrate, an InSb substrate, a GaP substrate, and an InGaAs substrate. The silicon semiconductor substrate can be such various substrates on which a semiconductor element structure and an insulating layer are formed entirely or partially.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A fabrication method for a semiconductor device comprising:
    injecting ions into a first substrate;
    joining the first substrate and a second substrate;
    irradiating the first substrate and the second substrate with a microwave having a frequency of 5.8 GHz or more and 30 GHz or less such that torsional vibrations of bonds between atoms in the first substrate are caused, to agglomerate the ions in a planar state in a desired position in the first substrate and form an agglomeration region spreading in a planar state;
    separating the second substrate provided with a part of the first substrate from the rest of the first substrate by exfoliating the joined first substrate from the second substrate in the agglomeration region; and
    grinding a part of the second substrate on a back surface opposite to an exfoliated surface in the second substrate provided with a part of the first substrate.

2. The fabrication method for a semiconductor device according to claim 1, further comprising forming a semiconductor element in a part of the first substrate.

3. The fabrication method for a semiconductor device according to claim 1, wherein the second substrate is high as compared with the first substrate with regard to at least one of oxygen concentration, carbon concentration, metal atom concentration and crystal defect concentration in the substrate.

4. The fabrication method for a semiconductor device according to claim 1, wherein
    the first substrate includes silicon, and
    the second substrate is made of any one of quartz, glass, graphite, stainless, plastics, polyimide, and PET.

5. The fabrication method for a semiconductor device according to claim 1, wherein the second substrate is a substrate close in coefficient of thermal expansion to the first substrate.

6. The fabrication method for a semiconductor device according to claim 1, wherein the first substrate comprises:
    a first layer containing boron or carbon; and
    a second layer as an epitaxial layer, containing boron or carbon at low concentration as compared with the first layer, or containing neither boron nor carbon.

7. The fabrication method for a semiconductor device according to claim 1, wherein the second substrate comprises an oxide film.

8. The fabrication method for a semiconductor device according to claim 1, wherein the microwave is irradiated such that a substrate temperature of the first substrate and the second substrate joined together is 300° C. or less.

9. The fabrication method for a semiconductor device according to claim 1, wherein the first substrate and the second substrate joined together are cooled during irradiating the microwave.

10. The fabrication method for a semiconductor device according to claim 9, wherein the cooling is performed by passing inert gas through a back surface of the first substrate, a back surface of the second substrate, or the back surfaces of both the first and second substrates.

11. The fabrication method for a semiconductor device according to claim 1, further comprising:
    flattening a exfoliated surface of the rest of the first substrate obtained by exfoliating, and
    forming an epitaxial growth layer on the flattened exfoliated surface.

12. The semiconductor device according to claim 1, wherein a power density of the microwave is 50 to 1500 W per cm$^2$.

13. The semiconductor device according to claim 1, wherein the first substrate and the second substrate are joined by heating the first substrate and the second substrate at 200° C. or less.

* * * * *